(12) United States Patent
Ono et al.

(10) Patent No.: US 11,839,068 B2
(45) Date of Patent: Dec. 5, 2023

(54) ELECTRIC POWER CONVERTER

(71) Applicant: NISSAN MOTOR CO., LTD., Yokohama (JP)

(72) Inventors: Kimihiro Ono, Kanagawa (JP); Susumu Kumakura, Kanagawa (JP); Rei Takahashi, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 170 days.

(21) Appl. No.: 17/431,227

(22) PCT Filed: Feb. 18, 2019

(86) PCT No.: PCT/IB2019/000172
§ 371 (c)(1),
(2) Date: Aug. 16, 2021

(87) PCT Pub. No.: WO2020/169998
PCT Pub. Date: Aug. 27, 2020

(65) Prior Publication Data
US 2022/0142014 A1 May 5, 2022

(51) Int. Cl.
*H02B 1/48* (2006.01)
*H05K 7/20* (2006.01)
*H02M 7/00* (2006.01)
*H05K 5/04* (2006.01)

(52) U.S. Cl.
CPC ........... *H05K 7/20927* (2013.01); *H02B 1/48* (2013.01); *H02M 7/003* (2013.01); *H05K 5/04* (2013.01)

(58) Field of Classification Search
None
See application file for complete search history.

(56) References Cited

U.S. PATENT DOCUMENTS

| | | | |
|---|---|---|---|
| 8,184,438 B2* | 5/2012 | Kaneko | H05K 7/026 361/728 |
| 2002/0084091 A1* | 7/2002 | Moriwaki | H01G 4/38 174/534 |
| 2002/0158329 A1 | 10/2002 | Kimura et al. | |
| 2008/0007197 A1* | 1/2008 | Obata | H02M 1/126 318/801 |

(Continued)

FOREIGN PATENT DOCUMENTS

| | | |
|---|---|---|
| JP | 2003-18864 A | 1/2003 |
| JP | 2008-67546 A | 3/2008 |
| JP | 2018-121457 A | 8/2018 |

*Primary Examiner* — Courtney L Smith
(74) *Attorney, Agent, or Firm* — Foley & Lardner LLP

(57) ABSTRACT

Provided is an electric power converter that includes an inverter which includes plural electric parts, a smoothing capacitor configured to smooth electric power, a housing configured to house the inverter and the smoothing capacitor and a first conductor portion configured to connect the smoothing capacitor and the inverter. The housing includes a base portion made of a resin material and a cover portion attached to the base portion to cover the inverter and the smoothing capacitor. The inverter and the smoothing capacitor are mounted on the base portion. The first conductor portion is placed in the vicinity of or in contact with the base portion of the housing in the middle of connection between the smoothing capacitor and the inverter.

11 Claims, 18 Drawing Sheets

(56) References Cited

U.S. PATENT DOCUMENTS

| | | | | |
|---|---|---|---|---|
| 2012/0020025 A1* | 1/2012 | Sotome | ............... | H01G 4/228 361/704 |
| 2014/0286064 A1* | 9/2014 | Kamizuma | ............ | H01G 2/08 361/301.5 |
| 2015/0334875 A1* | 11/2015 | Topolewski | ...... | H05K 7/20254 165/80.4 |
| 2017/0229246 A1* | 8/2017 | Nishiyama | ............ | H01G 4/40 |
| 2019/0173394 A1* | 6/2019 | Miura | .................. | B60L 50/51 |

* cited by examiner

ELECTRIC POWER CONVERTER

TECHNICAL FIELD

The present invention relates to an electric power converter.

BACKGROUND ART

JP2018-121457A discloses an electric power converter having an inverter, a smoothing capacitor, and a metal housing configured to house the inverter and the smoothing capacitor. In this electric power converter, the smoothing capacitor and the inverter are connected by a conductor portion, and in order to ensure an insulation property between the conductor portion and the metal housing, an insulating member is placed between the conductor portion and the housing.

SUMMARY OF INVENTION

However, with the electric power converter described above, the insulating member which is a separate member is placed between the conductor portion and the housing. Thus, the number of constituent parts is increased and manufacturing cost is increased.

Meanwhile, it is also possible to ensure the insulation property by increasing an insulation space distance of the conductor portion and the metal housing without using an insulating member. However, in this case, there is a need for a large space and the size of the converter is increased.

In consideration with the above problem, an object of the present invention is to provide an electric power converter capable of reducing cost and saving a space while ensuring an insulation property between a conductor portion connected to a smoothing capacitor and a housing.

According to an aspect of this invention, there is provided an electric power converter that includes an inverter which includes plural electric parts, a smoothing capacitor configured to smooth electric power, a housing configured to house the inverter and the smoothing capacitor and a first conductor portion configured to connect the smoothing capacitor and the inverter. The housing includes a base portion made of a resin material and a cover portion attached to the base portion to cover the inverter and the smoothing capacitor. The inverter and the smoothing capacitor are mounted on the base portion. The first conductor portion is placed in the vicinity of or in contact with the base portion of the housing in the middle of connection between the smoothing capacitor and the inverter.

DESCRIPTION OF EMBODIMENTS

Hereinafter, embodiments of the present invention will be described with reference to the drawings, etc.

First Embodiment

With reference to FIGS. 1 to 5, an electric power converter 100 according to a first embodiment of the present invention will be described.

Figure 1:
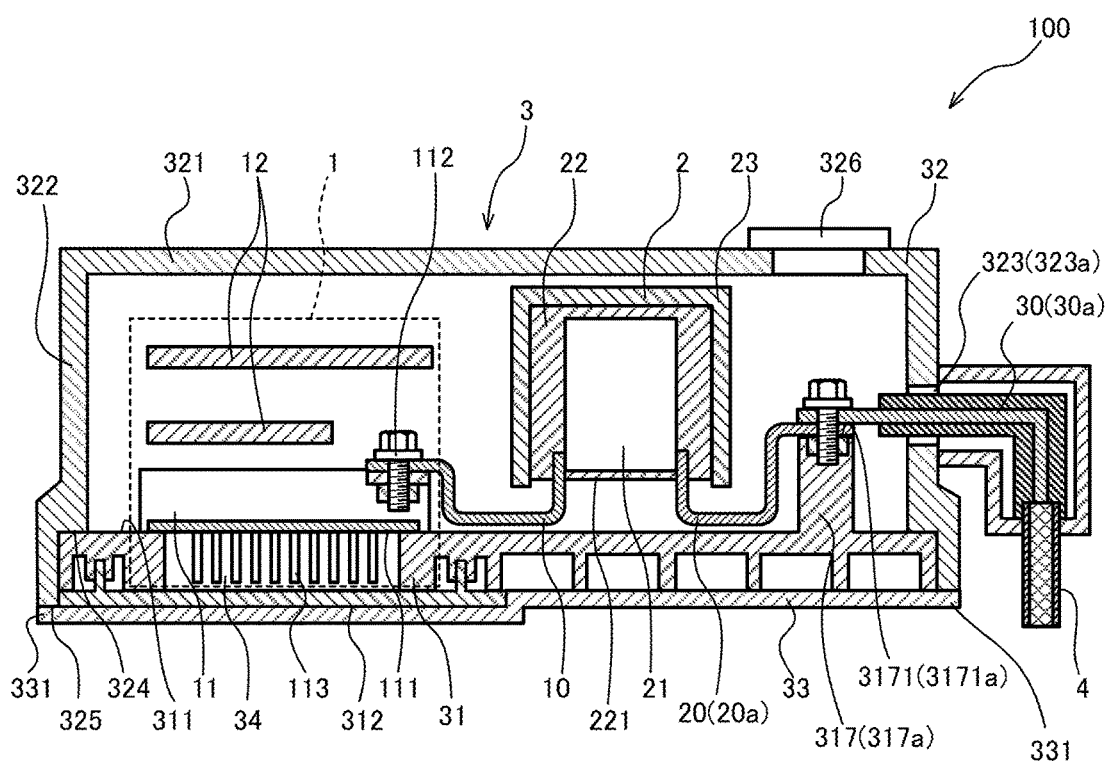
FIG. 1 is a schematic sectional view of an electric power converter according to a first embodiment.
Figure 2:
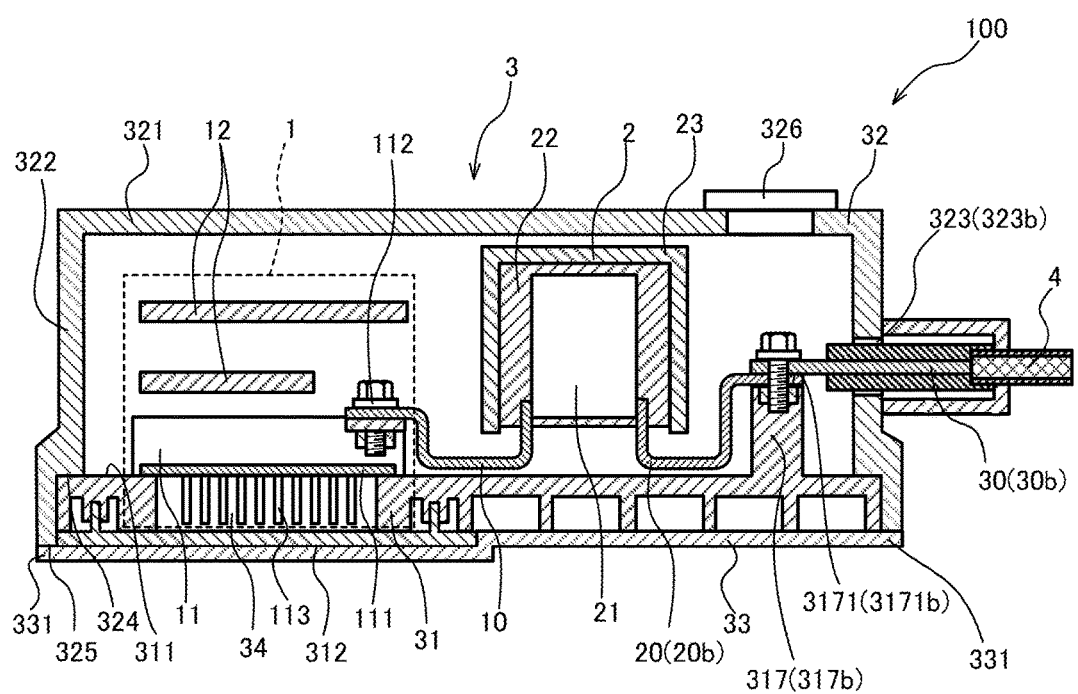
FIG. 2 is a schematic sectional view of the electric power converter according to the first embodiment at a position different from FIG. 1.

FIGS. 1 and 2 are schematic sectional views of the electric power converter according to the first embodiment. FIG. 1 is a sectional view of a part including input conductor portions, and FIG. 2 is a sectional view of a part including output conductor portions.

As shown in FIGS. 1 and 2, the electric power converter 100 includes an inverter 1, a smoothing capacitor 2, and a housing 3, and disposed on a vehicle, etc.

The inverter 1 and the smoothing capacitor 2 are housed in the housing 3. The inverter 1 and the smoothing capacitor 2 are electrically connected to each other by plural conductor portions 10 (first conductor portions), and the smoothing capacitor 2 and a power source 4 outside the housing are electrically connected to each other by plural conductor portions 20, 30 (second conductor portions).

The inverter 1 includes plural electric parts, including a power module 11 in which semiconductor devices are built and a control board 12 which includes a control circuit, and has a function of converting electric power into a direct current or an alternate current.

The power module 11 is formed by combining the plural semiconductor devices. The power module 11 is mounted on a substrate 111, and fixed onto the substrate 111 by bolts, etc. The substrate 111 is fixed to a base portion 31 of the housing 3 to be described later by bolts, etc. The power module 11 is electrically connected to the control board 12 and connected to the smoothing capacitor 2 via the conductor portions 10. The conductor portions 10 are fixed to the power module 11 by bolts, etc. at a terminal portion 112 provided in the power module 11.

The smoothing capacitor 2 includes a capacitor element 21, a filler 22, and a capacitor case 23, and is arranged in line with the inverter 1 in the substantially horizontal direction. The capacitor case 23 is made of resin such as polyphenylene sulfide (PPS) and polyphthalamide (PPA), and houses the capacitor element 21. The capacitor element 21 is connected to the power module 11 of the inverter 1 via the conductor portions 10 and connected to the power source 4 outside the housing 3 via the conductor portions 20 and the conductor portions 30. The filler 22 is, for example, a potting material containing silicon, fills the periphery of the capacitor element 21 and fixes the capacitor element 21 in the capacitor case 23.

The housing 3 includes the base portion 31 on which the inverter 1 and the smoothing capacitor 2 are mounted, a cover portion 32 attached to the base portion 31 to cover the inverter 1 and the smoothing capacitor 2, and a thin plate 33 provided on a lower surface of the base portion 31, the thin plate functioning as a bottom plate of the cover portion 32.

The base portion 31 is made of an electrically-insulating resin material such as polyphenylene sulfide (PPS) and polyphthalamide (PPA) as a plate-like member, and the inverter 1 and the smoothing capacitor 2 are disposed on a mount surface 311. The base portion 31 includes a cooling passage 34 (first coolant flow passage) through which cooling water (coolant) that cools the inverter 1 flows below a part where the inverter 1 is disposed. On a lower surface 312 of the base portion 31, the metal thin plate 33 made of aluminum, etc. which is larger than an outer shape of the lower surface 312 is provided.

On an upper surface of the cooling passage 34 of the base portion 31, the substrate 111 having a larger outer shape than the cooling passage 34 is installed, and the substrate 111 is fastened to the base portion 31 by bolts, etc. Fins 113 are provided in a lower portion of the power module 11. Plural holes through which the fins 113 pass are provided in the substrate 111, and the fins 113 are brought in contact with the cooling water in the cooling passage 34 through the holes. Although the fins 113 are preferably provided in the power module 11 to be brought into contact with the cooling water, the present invention is not necessarily limited to this. No fins 113 may be provided.

The cover portion 32 is made of a metal material such as aluminum, and attached to the base portion 31 to cover the periphery of the inverter 1 and the smoothing capacitor 2. The cover portion 32 includes an upper wall 321 and a side wall 322. An opening 323a (FIG. 1) opened to let input conductor portions 30a connected to the power source 4 pass through, and an opening 323b (FIG. 2) opened to let output conductor portions 30b connected to the power source 4 pass through are formed in the side wall 322. A stepped portion 324 having an end surface abutted with the mount surface 311 of the base portion 31 is formed in an inside part of the side wall 322. A leading end surface 325 of the side wall 322 is abutted with an outer peripheral edge 331 of the thin plate 33 provided on the lower surface 312 of the base portion 31. The cover portion 32, the base portion 31, and the thin plate 33 are fastened in a part where the stepped portion 324 of the cover portion 32 and the mount surface 311 of the base portion 31 are abutted by fastening together by bolts, etc. from the outside of the thin plate 33. In such a way, by completely covering the inverter 1 and the smoothing capacitor 2 by the cover portion 32 and the thin plate 33 made of a metal material, it is possible to enhance an electromagnetic shielding property of the electric power converter 100. An openable/closable lid portion 326 may be provided on the upper wall 321 of the cover portion 32 so that maintenance can be made to fastening of the conductor portions 20 and the conductor portions 30 to be described later.

Figure 3:
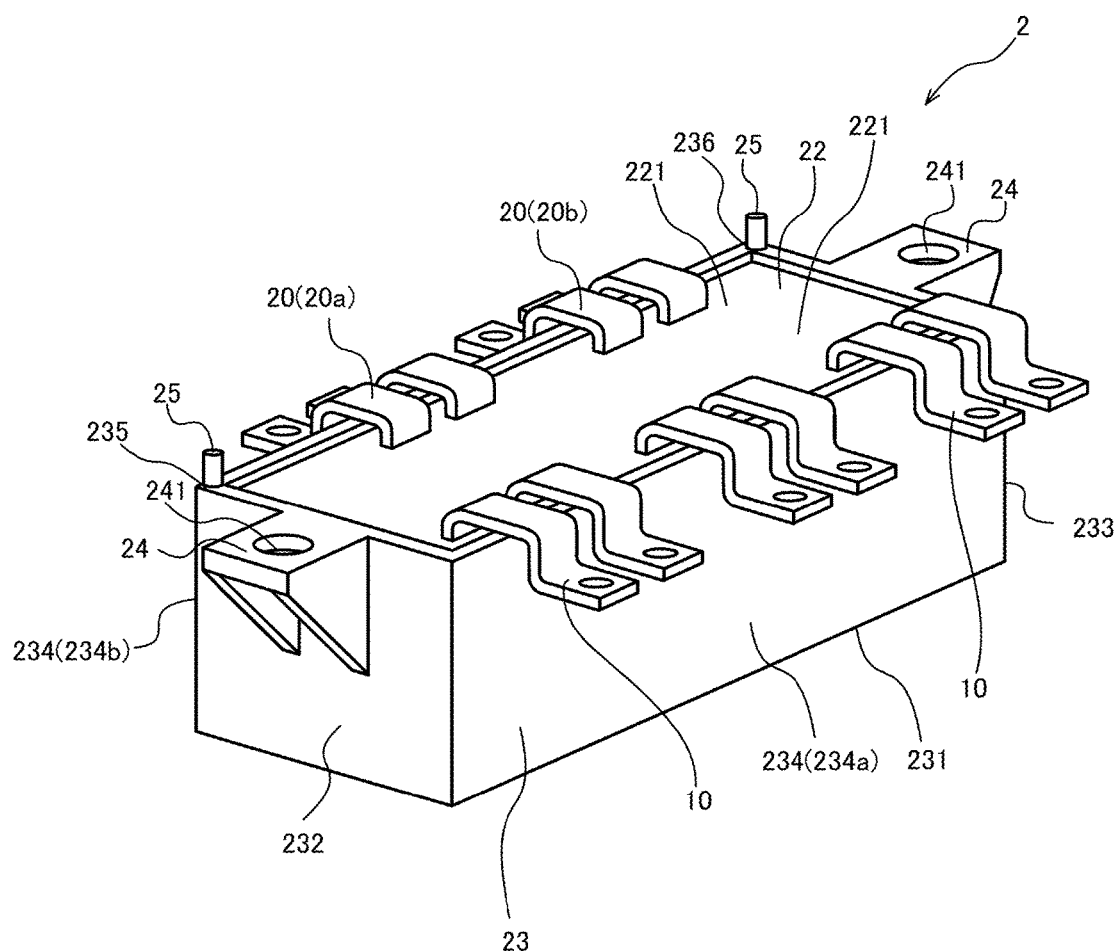
FIG. 3 is a perspective bottom view of a smoothing capacitor.

FIG. 3 is a perspective bottom view of the smoothing capacitor 2.

The capacitor case 23 of the smoothing capacitor 2 houses the capacitor element 21 inside, and the periphery of the capacitor element 21 is filled with the filler 22. The periphery of the filler 22 is covered by an upper surface 231, a front surface 232, a back surface 233, and side surfaces 234 of the capacitor case 23. A bottom surface of the capacitor case 23 is open, and the filler 22 forms a potting surface 221 on a bottom surface of the smoothing capacitor 2.

The capacitor case 23 includes brackets 24 projecting outward from the front surface 232 and the back surface 233 and positioning pins 25 projecting downward from the bottom surface. The brackets 24 are members configured to fasten the smoothing capacitor 2 to the housing 3. A hole portion 241 through which a bolt, etc. for fastening the smoothing capacitor 2 to the base portion 31 passes is provided in each of the brackets 24. The positioning pins 25 are members configured to determine a horizontal position of the smoothing capacitor 2 in the housing 3. The positioning pins 25 project to the lower side of the bottom surface respectively from a corner portion 235 where an one-side side surface 234b of the capacitor case 23 and the front surface 232 are connected on the bottom surface of the smoothing capacitor 2, and from a corner portion 236 where the one-side side surface 234b of the capacitor case 23 and the back surface 233 are connected on the bottom surface of the smoothing capacitor 2. By inserting the positioning pins 25 into the base portion 31, the horizontal position of the smoothing capacitor 2 with respect to the housing 3 is determined.

In the present embodiment, the positioning pins 25 are respectively provided in the corner portions 235, 236 where the one-side side surface 234b of the capacitor case 23 is connected to the front surface 232 and the back surface 233 on the bottom surface of the smoothing capacitor 2. However, the number and the position of the positioning pins 25 are not limited to this. For example, the positioning pins 25 may be provided in all the four corner portions on the bottom surface of the smoothing capacitor 2.

The plural conductor portions 10 and 20 connected to the capacitor element 21 extend to the outside of the smoothing capacitor 2 from the potting surface 221. The conductor portions 10, the conductor portions 20, and the conductor portions 30 to be described later are metal bus bars made of, for example, highly-conductive copper, aluminum, etc. The conductor portions 10 project to the outside of the smoothing capacitor 2 from the vicinity of a one-side side surface 234a of the capacitor case 23 on the potting surface 221, and electrically connect the capacitor element 21 and the power module 11 of the inverter 1. The conductor portions 20 project to the outside of the smoothing capacitor 2 from the vicinity of the other-side side surface 234b of the capacitor case 23 on the potting surface 221, and electrically connect the capacitor element 21 and the power source 4 outside the electric power converter 100 via the conductor portions 30. The conductor portions 20 and the conductor portions 30 respectively include input conductor portions 20a and conductor portions 30a to which the electric power is inputted from the power source 4, and output conductor portions 20b and conductor portions 30b from which the electric power is outputted to the power source 4. Details of arrangement of the conductor portions will be described later.

Figure 4:
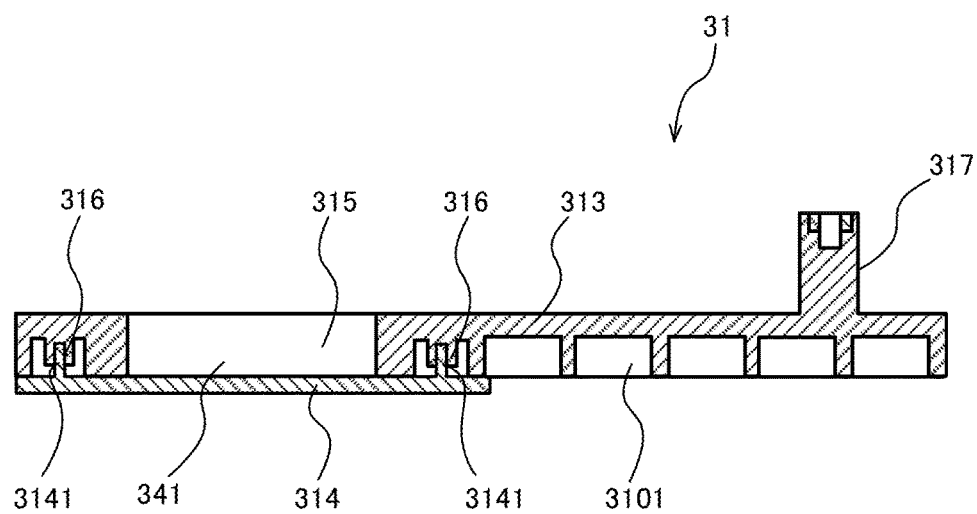
FIG. 4 is a sectional view of a base portion of a housing before a cover portion is attached.
Figure 5:
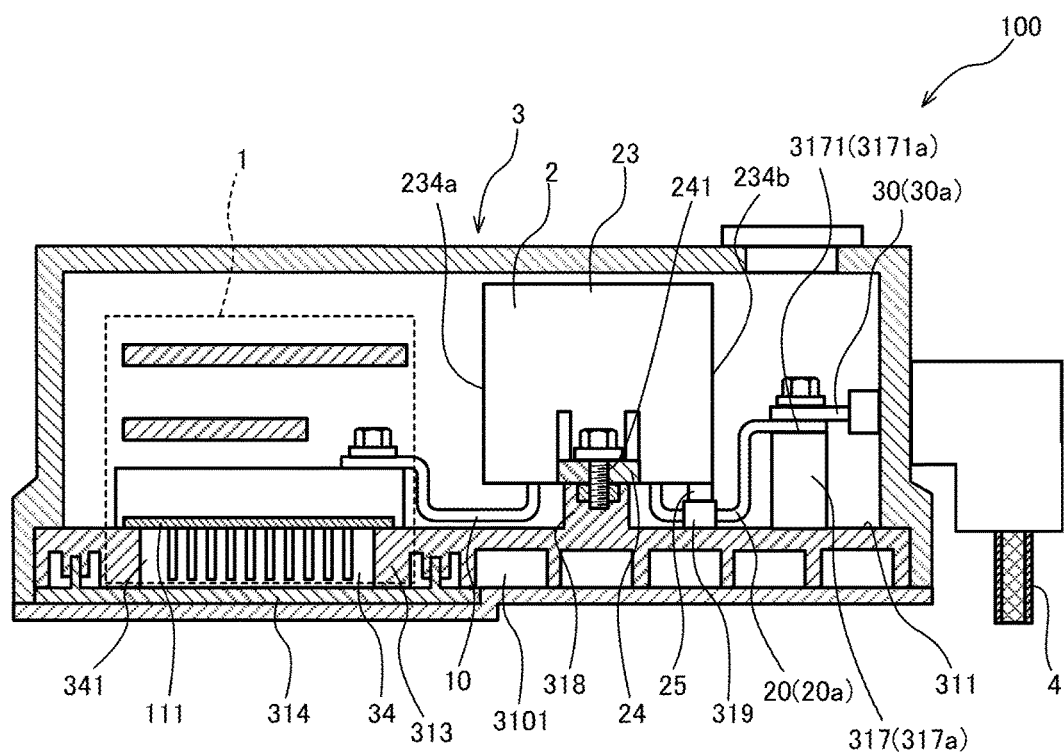
FIG. 5 is a view in which the smoothing capacitor is attached.

FIG. 4 is a sectional view of the base portion 31 of the housing 3, the view showing the base portion 31 before the cover portion 32 is attached. FIG. 5 is a sectional view of the electric power converter 100, the view in which the smoothing capacitor 2 is attached.

The base portion 31 is made of an electrically-insulating resin material, and as shown in FIG. 4, and includes a main body portion 313 and a bottom plate portion 314. The main body portion 313 has an opening 315 configured to form the cooling passage 34, joining portions 316 configured to join the bottom plate portion 314, and terminal portions 317 configured to fasten the conductor portions 20 and the conductor portions 30. As shown in FIG. 5, the main body portion 313 further has holding portions 318 configured to hold the smoothing capacitor 2 and pin receiving portions 319 into which the positioning pins 25 configured to position the smoothing capacitor 2 are inserted.

The opening 315 of the main body portion 313 is provided at a point of the base portion 31 where the inverter 1 is mounted, and an upper surface and a bottom surface are open. The joining portions 316 are parts into which projected portions 3141 of the bottom plate portion 314 to be described later are inserted and joined. The joining portions 316 are holes whose lower surfaces are open, and provided around the opening 315.

The bottom plate portion 314 has a larger outer shape than the opening 315 of the main body portion 313, and has the projected portions 3141 projecting upward from an upper surface of the bottom plate portion 314 at positions corresponding to the joining portions 316 of the main body portion 313. The projected portions 3141 and the joining portions 316 of the main body portion 313 are joined to each other by welding, etc. By joining the main body portion 313 and the bottom plate portion 314, a recessed portion 341 is formed at a position of the opening 315. The recessed portion 341 is a groove configured to form the cooling passage 34 through which the cooling water that cools the inverter 1 flows. As shown in FIG. 5, by covering an upper portion of the recessed portion 341 by the substrate 111 of the power module 11, the cooling passage 34 (first coolant flow passage) enclosed by the main body portion 313, the bottom plate portion 314, and the substrate 111 is formed.

As shown in FIG. 5, the terminal portions 317 of the main body portion 313 are provided in parts where the conductor portions 20 connected to the smoothing capacitor 2 and the conductor portions 30 connected to the power source 4 are connected, at positions between a point where the smoothing capacitor 2 is installed and the side wall 322 of the housing 3. The terminal portions 317 are integrated with the base portion 31 to project upward from the mount surface 311 of the base portion 31. The conductor portions 20 and the conductor portions 30 are fastened on upper surfaces 3171 of the terminal portions 317 by fastening together to the base portion by bolts, etc. In such a way, by integrating the terminal portions 317 with the base portion 31 that forms the housing 3, it is possible to reduce cost in comparison to a case where the terminal portions 317 are provided as separate members.

The holding portions 318 of the main body portion 313 are parts configured to hold the smoothing capacitor 2 and are provided to project upward from the mount surface 311 of the base portion 31 at positions opposing the brackets 24 of the smoothing capacitor 2. The smoothing capacitor 2 is fastened to the holding portions 318 by bolts, etc. via the hole portions 241 of the brackets 24. Thereby, up-down movement of the smoothing capacitor 2 with respect to the housing 3 is particularly regulated.

The pin receiving portions 319 of the main body portion 313 are provided to project upward from the mount surface 311 of the base portion 31 at positions corresponding to the positioning pins 25 of the smoothing capacitor 2. By inserting the positioning pins 25 into the pin receiving portions 319, the horizontal position of the smoothing capacitor 2 with respect to the housing 3 is determined.

In order to make positioning of the smoothing capacitor 2 easier, it is preferable to respectively provide the positioning pins 25 in the capacitor case 23 and the pin receiving portions 319 in the base portion 31 as described above. However, these are not necessarily provided.

A hollow portion 3101 whose bottom surface is open may be formed in a part of the base portion 31 where no cooling passage 34 is provided. Thereby, weight of the electric power converter 100 is reduced. The number and the shape of the hollow portion 3101 are not particularly limited. For example, one large hollow portion may be provided or a bottom surface may be closed.

Next, the details of the arrangement of the conductor portions will be described.

As shown in FIGS. 1 and 2, one ends of the conductor portions 10 that electrically connect the inverter 1 and the smoothing capacitor 2 are connected to the capacitor element 21 of the smoothing capacitor 2 and project downward from the potting surface 221 of the smoothing capacitor 2. The other ends of the conductor portions 10 are fixed to the power module 11 by bolts, etc. at the terminal portion 112 provided in the power module 11 of the inverter 1. Thereby, the inverter 1 and the smoothing capacitor 2 are electrically connected by the conductor portions 10.

The conductor portions 10 are placed in the vicinity of the base portion 31 of the housing 3 in the middle of connection between the capacitor element 21 of the smoothing capacitor 2 and the power module 11 of the inverter 1. In such a way, even when the conductor portions 10 are arranged at positions in the vicinity of the base portion 31, an insulation property between the conductor portions 10 and the housing 3 is ensured as the base portion 31 is made of an insulating material. Since the conductor portions 10 are placed in the vicinity of the base portion 31, heat of the conductor portions 10 is also transferred to the base portion 31 via a space between the base portion 31 and the conductor portions 10. Since the base portion 31 includes the cooling passage 34, the base portion 31 is also cooled by the cooling water flowing through the cooling passage 34. Therefore, heat exchange is made between the base portion 31 cooled by the cooling water and the conductor portions 10, so that the smoothing capacitor 2 connected to the conductor portions 10 is cooled.

The conductor portions 20 and the conductor portions 30 are members configured to electrically connect the smoothing capacitor 2 and the power source 4 outside the housing 3. The conductor portions 20 include the input conductor portions 20a and the output conductor portions 20b, and the conductor portions 30 include the input conductor portions 30a and the output conductor portions 30b. As shown in FIGS. 1 to 3, one ends of the conductor portions 20a, 20b are connected to the capacitor element 21 of the smoothing capacitor 2 and project downward from the potting surface 221 of the smoothing capacitor 2. The other ends of the conductor portions 20a, 20b are connected to the conductor portions 30a, 30b on the upper surfaces 3171a, 3171b of the terminal portions 317a, 317b projecting upward from the mount surface 311 of the base portion 31. The conductor portions 20a, 20b and the conductor portions 30a, 30b are fastened together to the base portion 31 by bolts, etc. on the upper surfaces 3171a, 3171b of the terminal portions 317a, 317b.

The conductor portions 20a, 20b are placed in the vicinity of the base portion 31 of the housing 3 in the middle of connection between the capacitor element 21 of the smoothing capacitor 2 and the conductor portions 30a, 30b. In such a way, even when the conductor portions 20a, 20b are arranged at positions in the vicinity of the base portion 31, an insulation property between the conductor portions 20a, 20b and the housing 3 is ensured as the base portion 31 is made of an insulating material. As well as the conductor portions 10, the conductor portions 20a, 20b are placed in the vicinity of the base portion 31. Thus, heat of the conductor portions 20a, 20b is also transferred to the base portion 31 via a space between the base portion 31 and the conductor portions 20a, 20b. That is, as well as the conductor portions 10, heat exchange is made between the base portion 31 cooled by the cooling water and the conductor portions 20a, 20b, so that the smoothing capacitor 2 connected to the conductor portions 20a, 20b is cooled.

One ends of the conductor portions 30a, 30b are connected to the conductor portions 20a, 20b on the upper surfaces 3171a, 3171b of the terminal portions 317a, 317b and provided to extend to the outside of the housing 3 from the openings 323a, 323b formed in the side wall 322 of the housing 3. The other ends of the conductor portions 30a, 30b are connected to the power source 4 outside. In such a way, the smoothing capacitor 2 and the power source 4 are electrically connected via the input conductor portions 20a and conductor portions 30a and the output conductor portions 20b and 30b.

Length of parts of the conductor portions 10 and the conductor portions 20 in the vicinity of the base portion 31 are not particularly limited. However, in order to more increase a cooling effect by the cooling water, the distance of the parts in the vicinity of the base portion 31 is preferably as long as possible.

In FIG. 3, the six conductor portions 10, the two conductor portions 20a, and the two conductor portions 20b project from the smoothing capacitor 2. However, the number of the conductor portions is not limited to this.

With the electric power converter 100 of the first embodiment described above, it is possible to obtain the following effects.

In the electric power converter 100, the housing 3 includes the base portion 31 made of a resin material, the base portion on which the inverter 1 and the smoothing capacitor 2 are mounted, and the cover portion 32 attached to the base portion 31 to cover the inverter 1 and the smoothing capacitor 2. The conductor portions 10 (first conductor portions) configured to connect the smoothing capacitor 2 and the inverter 1 are placed in the vicinity of the base portion 31 of the housing 3 in the middle of connection between the smoothing capacitor 2 and the inverter 1. In such a way, by making the base portion 31 of an insulating material, the insulation property between the conductor portions 10 and the housing 3 is ensured, and the conductor portions 10 are arranged at the positions in the vicinity of the base portion 31. Therefore, there is no need for placing a separate member such as an insulating member between the conductor portions 10 and the housing 3, so that cost can be reduced. In addition, since the conductor portions 10 are arranged at the positions in the vicinity of the base portion 31, a space can be saved in comparison to a case where an insulation space distance of the conductor portions 10 and the housing 3 is increased. That is, it is possible to provide the electric power converter capable of reducing cost and saving a space while ensuring the insulation property between the conductor portions 10 connected to the smoothing capacitor 2 and the housing 3.

Next, the electric power converter 100 includes the conductor portions 20, 30 (second conductor portions) configured to connect the smoothing capacitor 2 and the power source 4 outside the housing 3, and the conductor portions 20 are placed in the vicinity of the base portion 31 of the housing 3 in the middle of connection between the smoothing capacitor 2 and the power source 4. Since the base portion 31 is made of an insulating material, as well as the conductor portions 10, there is no need for placing a separate member such as an insulating member between the conductor portions 20 and the housing 3, so that cost can be reduced. In addition, since the conductor portions 20 are arranged at the positions in the vicinity of the base portion 31, a space can be saved in comparison to a case where an insulation space distance of the conductor portions 20 and the housing 3 is increased. That is, it is possible to provide the electric power converter capable of reducing cost and saving a space while ensuring the insulation property between the conductor portions 20 connected to the smoothing capacitor 2 and the housing 3.

The base portion 31 of the electric power converter 100 includes the cooling passage 34 (first coolant flow passage) through which the cooling water (coolant) that cools the inverter 1 flows. Thereby, the inverter 1 is directly cooled and the base portion 31 is also cooled by heat exchange between the cooling water and the base portion 31. Meanwhile, since the conductor portions 10, 20 are placed in the vicinity of the base portion 31, the heat of the conductor portions 10, 20 are also transferred to the base portion 31 via the spaces between the base portion 31 and the conductor portions 10, 20. Therefore, heat exchange is made between the base portion 31 cooled by the cooling water and the conductor portions 10, 20, and it is possible to improve a performance of cooling the smoothing capacitor 2 connected to the conductor portions 10, 20. That is, it is possible to provide the electric power converter in which an effect of cooling the smoothing capacitor 2 is improved while ensuring the insulation property between the conductor portions 10, 20 connected to the smoothing capacitor 2 and the housing 3.

Modified Example of First Embodiment

Figure 6:
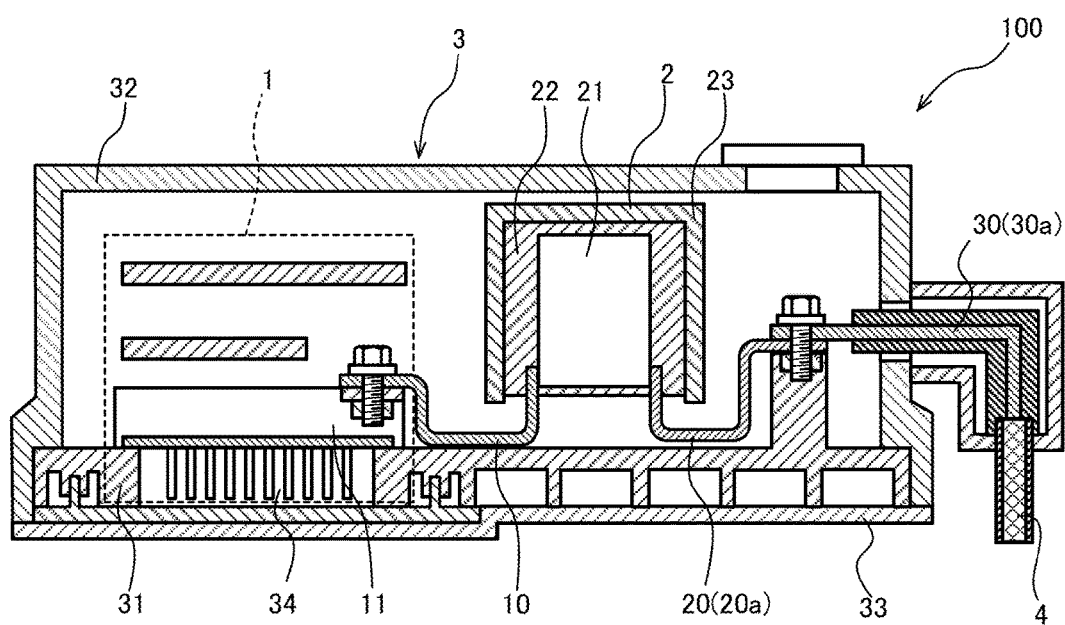
FIG. 6 is a schematic sectional view of an electric power converter according to a modified example of the first embodiment.

With reference to FIG. 6, a modified example of the electric power converter 100 according to the first embodiment of the present invention will be described.

FIG. 6 is a schematic sectional view of an electric power converter 100 according to the modified example of the first embodiment. As shown in FIG. 6, in the present modified example, the conductor portions 10 are arranged in contact with the base portion 31 of the housing 3 in the middle of connection between the capacitor element 21 of the smoothing capacitor 2 and the power module 11 of the inverter 1. In such a way, even when the conductor portions 10 are placed in contact with the base portion 31, the insulation property between the conductor portions 10 and the housing 3 is ensured as the base portion 31 is made of an insulating material.

According to the modified example of the first embodiment described above, it is possible to further obtain the following effects.

In the electric power converter 100, the base portion 31 of the housing 3 is made of an insulating resin material, and the conductor portions 10 (first conductor portions) configured to connect the smoothing capacitor 2 and the inverter 1 are placed in contact with the base portion 31 of the housing 3 in the middle of connection between the smoothing capacitor 2 and the inverter 1. That is, by making the base portion 31 of an insulating material, the insulation property between the conductor portions 10 and the housing 3 is ensured, and the conductor portions 10 are arranged in contact with the base portion 31. In such a way, by placing the conductor portions 10 in contact with the housing 3, a space between the conductor portions 10 and the housing 3 is eliminated. Thus, it is possible to save a space more in the electric power converter. That is, it is possible to provide the electric power converter in which a space is saved more while ensuring the insulation property between the conductor portions 10 connected to the smoothing capacitor 2 and the housing 3.

Since the conductor portions 10 are placed in contact with the base portion 31 of the housing 3, heat exchange is made between the cooling water flowing through the cooling passage 34 (first coolant flow passage) and the conductor portions 10 via the base portion 31. That is, heat exchange is made between the cooling water and the conductor portions 10 without going via a space between the conductor portions 10 and the base portion 31. Therefore, in comparison to a case where the conductor portions 10 are placed in no contact with the base portion 31 of the housing 3, the cooling effect by the cooling water flowing through the cooling passage 34 is more easily transmitted to the conductor portions 10, and it is possible to improve the performance of cooling the smoothing capacitor 2 connected to the conductor portions 10 more. That is, it is possible to provide the electric power converter in which the performance of cooling the smoothing capacitor 2 is improved more while ensuring the insulation property between the housing 3 and the conductor portions 10.

In the present embodiment, only the conductor portions 10 are placed in contact with the base portion 31. However, both the conductor portions 10 and the conductor portions 20 may be arranged in contact with the base portion 31, or only the conductor portions 20 may be placed in contact with the base portion 31 and the conductor portions 10 may be placed in the vicinity of the base portion 31.

Second Embodiment

Figure 7:
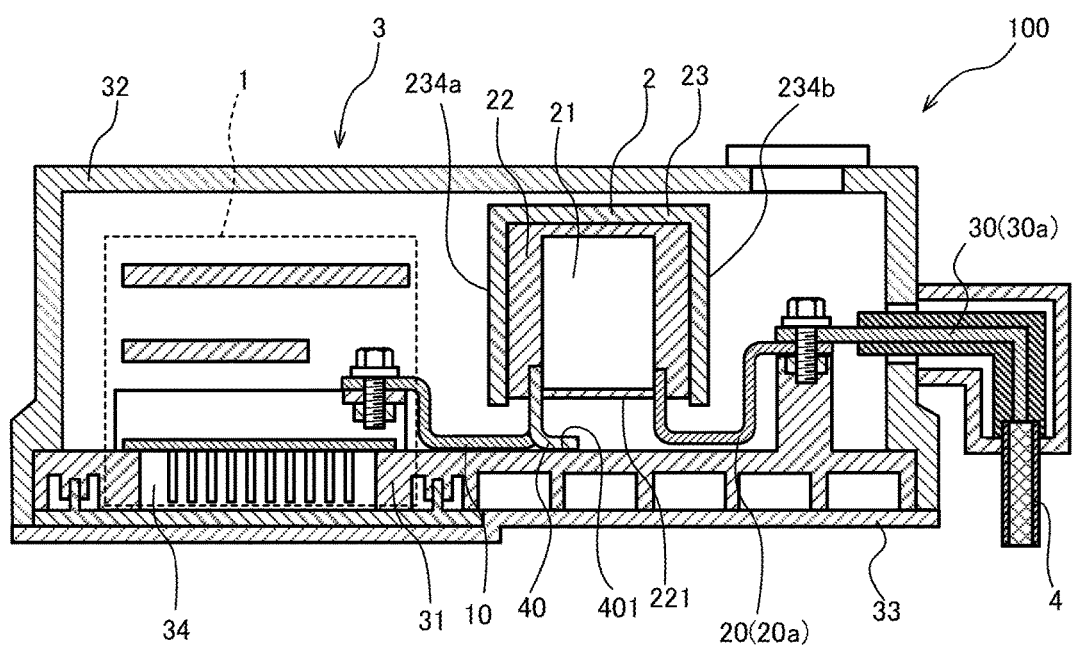
FIG. 7 is a schematic sectional view of an electric power converter according to a second embodiment.
Figure 8:
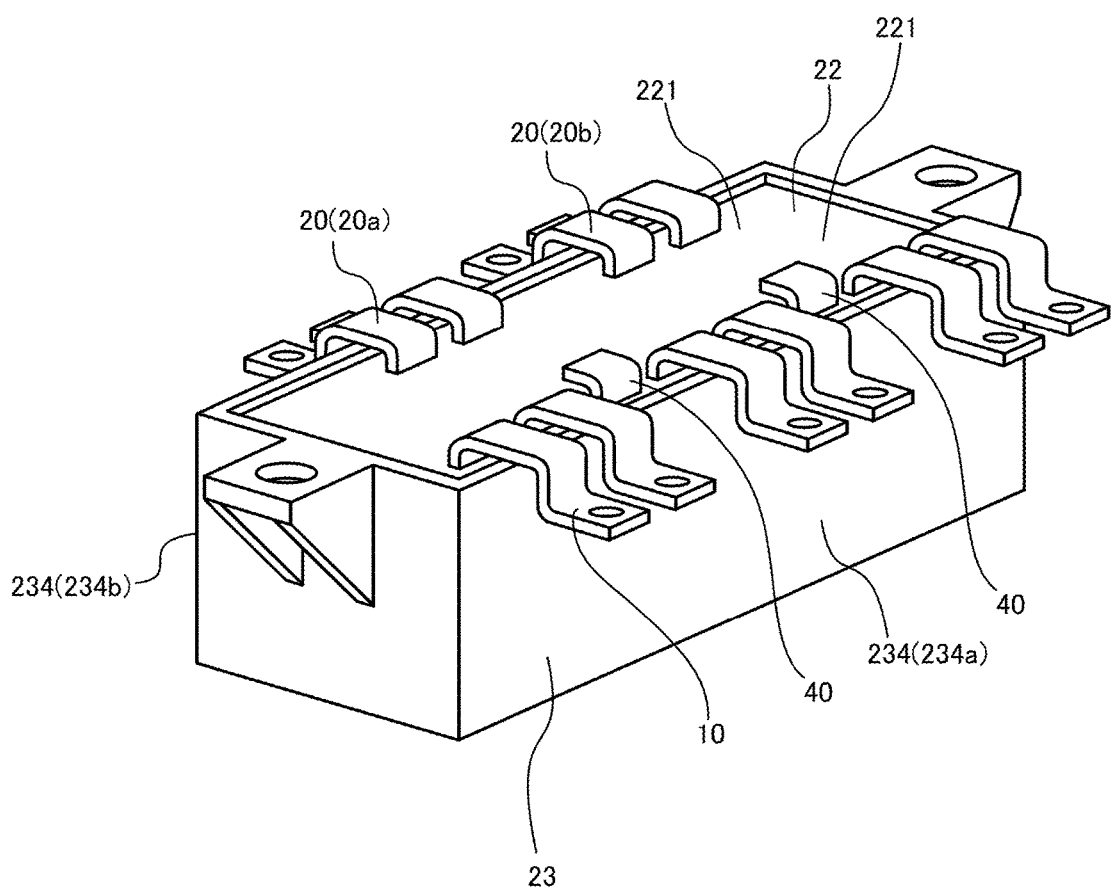
FIG. 8 is a perspective bottom view of a smoothing capacitor.

With reference to FIGS. 7 and 8, an electric power converter 100 according to a second embodiment will be described. The same elements as the first embodiment will be given the same reference signs and will not be described.

FIG. 7 is a schematic sectional view of the electric power converter 100 according to the second embodiment. FIG. 8 is a perspective bottom view of a smoothing capacitor 2. As shown in FIGS. 7 and 8, in the present embodiment, a point that conductor portions 40 (third conductor portions) exclusive for cooling are provided is different from the first embodiment and the modified example of the first embodiment.

As shown in FIG. 8, the smoothing capacitor 2 has a potting surface 221 formed by a filler 22 on a bottom surface. From the potting surface 221, the conductor portions 40 extend to the outside of the capacitor in addition to conductor portions 10 and conductor portions 20.

The conductor portions 40 are members configured to cool the capacitor, and are made of, for example, highly-conductive copper, aluminum, etc. As shown in FIG. 7, one ends of the conductor portions 40 are connected to a capacitor element 21, and the other ends are placed in contact with a base portion 31. The conductor portions 40 project to the outside of the smoothing capacitor 2 from the vicinity of a one-side side surface 234*a* of a capacitor case 23 on the potting surface 221, and are provided to extend to positions where the conductor portions 40 are in contact with the base portion 31. At the positions where the conductor portions 40 are in contact with the base portion 31, the conductor portions 40 are bent and provided to extend toward the inside of the smoothing capacitor 2 while in contact with the base portion 31. Thereby, contact surfaces 401 where the conductor portions 40 and the base portion 31 are in contact with each other are formed.

In such a way, the conductor portions 40 are placed in contact with the base portion 31. Thus, heat exchange is made between cooling water flowing through a cooling passage 34 and the conductor portions 40 via the base portion 31, so that the conductor portions 40 and the smoothing capacitor 2 connected to the conductor portions 40 are cooled. That is, by providing the conductor portions 40 exclusive for cooling, a cooling effect by the cooling water is transmitted to the conductor portions 40 via the base portion 31. Thus, a performance of cooling the smoothing capacitor 2 is improved more. Even when the conductor portions 40 are arranged at the positions where the conductor portions 40 are in contact with the base portion 31, an insulation property between the conductor portions 40 and a housing 3 is ensured as the base portion 31 is made of an insulating material.

The conductor portions 40 are bent at the positions where the conductor portions 40 are in contact with the base portion 31 and the contact surfaces 401 are formed between the conductor portions 40 and the base portion 31. Thus, a contact area of the conductor portions 40 and the base portion 31 is increased, and the performance of cooling the smoothing capacitor 2 is further improved.

With the electric power converter 100 according to the second embodiment described above, it is possible to obtain the following effects.

In the electric power converter 100, the base portion 31 of the housing 3 is made of an insulating resin material and the conductor portions 40 configured to cool the smoothing capacitor 2 are provided. The conductor portions 40 are connected to the smoothing capacitor 2 and have parts in contact with the base portion 31 of the housing 3. That is, by making the base portion 31 of an insulating material, the insulation property between the conductor portions 40 and the housing 3 is ensured, and the conductor portions 40 are placed in contact with the base portion 31. Thereby, heat exchange is made between the cooling water flowing through the cooling passage 34 and the conductor portions 40 via the base portion 31. In such a way, the cooling effect by the cooling water flowing through the cooling passage 34 is transmitted to the conductor portions 40 via the base portion 31. Thus, the performance of cooling the smoothing capacitor 2 connected to the conductor portions 40 is improved more. Therefore, it is possible to provide the electric power converter in which the effect of cooling the smoothing capacitor 2 is improved more while ensuring the insulation property of the housing 3 and the conductor portions 40.

In order to enhance the performance of cooling the smoothing capacitor 2 more, the conductor portions 40 are preferably arranged in contact with the base portion 31 as in the present embodiment. However, the present invention is not limited to this but the conductor portions 40 may be arranged at positions in the vicinity of the base portion 31.

In the present embodiment, the conductor portions 40 are bent toward the inside of the smoothing capacitor 2. However, the conductor portions 40 may be bent toward the outside of the smoothing capacitor 2.

In the present embodiment, the conductor portions 40 are provided to project to the outside of the smoothing capacitor 2 from the vicinity of the one-side side surface 234*a* of the capacitor case 23. However, the conductor portions 40 may be provided to project from the vicinity of the other-side side surface 234*b* of the capacitor case 23.

In FIG. 8, no positioning pins 25 are provided in the capacitor case 23. However, positioning pins 25 and pin receiving portions 319 may be provided to position the smoothing capacitor 2 as well as the first embodiment.

Modified Example of Second Embodiment

Figure 9:
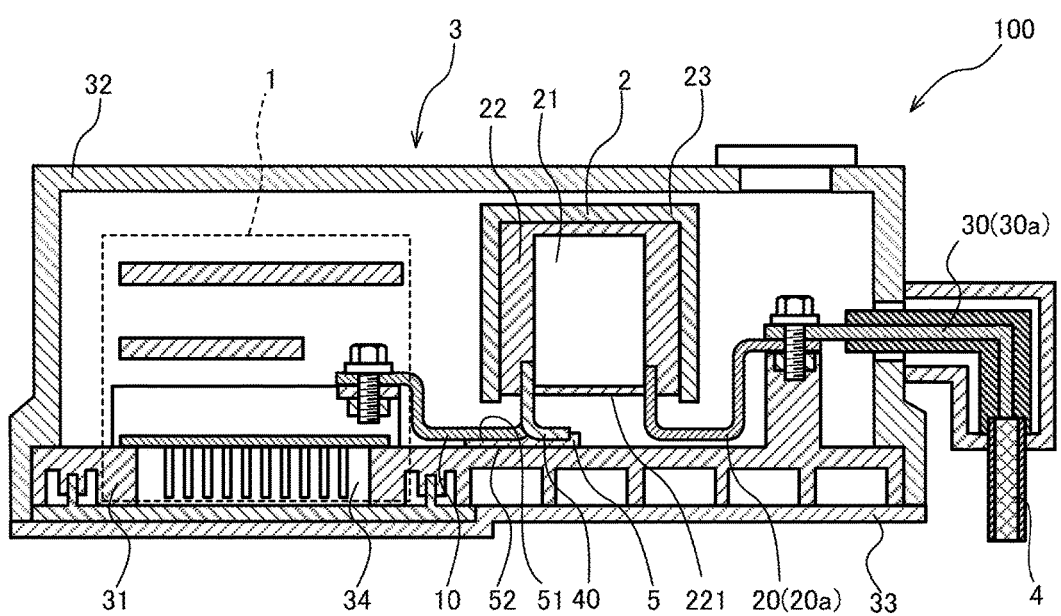
FIG. 9 is a schematic sectional view of an electric power converter according to a modified example of the second embodiment.

With reference to FIG. 9, an electric power converter 100 according to a modified example of the second embodiment will be described. The same elements as the other embodiment will be given the same reference signs and will not be described.

FIG. 9 is a schematic sectional view of the electric power converter 100 according to the modified example of the second embodiment. As shown in FIG. 9, in the present modified example, the conductor portions 10 (first conductor portions) and the conductor portions 40 (third conductor portions) are not placed in direct contact with the base portion 31 but elastic conductive members 5 are sandwiched between the conductor portions 10 and the conductor portions 40, and the base portion 31 of the housing 3.

As shown in FIG. 9, the conductor portions 10 projecting from the potting surface 221 which is formed on the bottom surface of the smoothing capacitor 2 are placed in the vicinity of the base portion 31 of the housing 3 in the middle of connection between the smoothing capacitor 2 and the inverter 1. The conductor portions 40 projecting from the potting surface 221 which is formed on the bottom surface of the smoothing capacitor 2 are bent toward the inside of the smoothing capacitor 2 at positions where the conductor portions 40 are in the vicinity of the base portion 31 of the housing 3. As well as the second embodiment, the conductor portions 40 may be bent toward the outside of the smoothing capacitor 2.

As shown in FIG. 9, the elastic conductive members 5 are placed between the conductor portions 10, 40 and the base portion 31. The elastic conductive members 5 are, for example, highly-conductive grease, adhesive, sheets, etc. and are respectively provided between the conductor portions and the base portion 31 in parts where the conductor portions 10, 40 are in the vicinity of the base portion 31. Upper surfaces 51 of the elastic conductive members 5 are in contact with the conductor portions 10, 40, and bottom surfaces 52 are in contact with the base portion 31.

In such a way, by placing the highly-conductive elastic conductive members 5 between the conductor portions 10, 40 and the base portion 31, the elastic conductive members 5 perform a function of absorbing dimensional tolerance between the conductor portions 10, 40 and the base portion 31. Thereby, in comparison to a case where the conductor portions 10, 40 are placed in direct contact with the base portion 31, it is possible to improve thermal conductivity between the conductor portions 10, 40 and the base portion 31. That is, a rate of heat exchange made via the base portion 31 between the cooling water flowing through the cooling passage 34 and the conductor portions 10, 40 is improved. Even when the conductor portions 10, 40 are placed in contact with the base portion 31 of the housing 3 via the highly-conductive elastic conductive members 5 in such a way, the insulation property between the conductor portions 10, 40 and the housing 3 is ensured as the base portion 31 is made of an insulating material.

According to the modified example of the second embodiment described above, it is possible to further obtain the following effect.

In the electric power converter 100, the base portion 31 of the housing 3 is made of an insulating resin material, the elastic conductive members 5 placed in contact with the base portion 31 are provided, and the conductor portions 10 (first conductor portions) and the conductor portions 40 (third conductor portions) are placed in contact with the elastic conductive members 5 in the parts where the conductor portions 10, 40 are in the vicinity of the base portion 31. That is, by making the base portion 31 of an insulating material, the insulation property between the conductor portions 10, 40 and the housing 3 is ensured, and the conductor portions 10, 40 are placed in contact with the base portion 31 via the elastic conductive members 5. In such a way, by providing the elastic conductive members 5 in contact with the base portion 31 and the conductor portions 10, 40 in the parts where the conductor portions 10, 40 are placed in the vicinity of the base portion 31, the elastic conductive members 5 perform the function of absorbing dimensional tolerance between the conductor portions 10, 40 and the base portion 31. Thereby, in comparison to a case where the conductor portions 10, 40 are placed in direct contact with the base portion 31, it is possible to improve thermal conductivity between the conductor portions 10, 40 and the base portion 31. Therefore, the rate of heat exchange made via the base portion 31 between the cooling water flowing through the cooling passage 34 and the conductor portions 10, 40 is improved, and it is possible to further improve the performance of cooling the smoothing capacitor 2. That is, it is possible to provide the electric power converter in which the performance of cooling the smoothing capacitor 2 is further improved while ensuring the insulation property between the housing 3 and the conductor portions 10, 40.

In the present embodiment, the elastic conductive members 5 are placed between the conductor portions 10, 40 and the base portion 31. However, elastic conductive members 5 placed in contact with the conductor portions 20 and the base portion 31 may be provided in parts where the conductor portions 20 are placed in the vicinity of the base portion 31.

Third Embodiment

Figure 10:
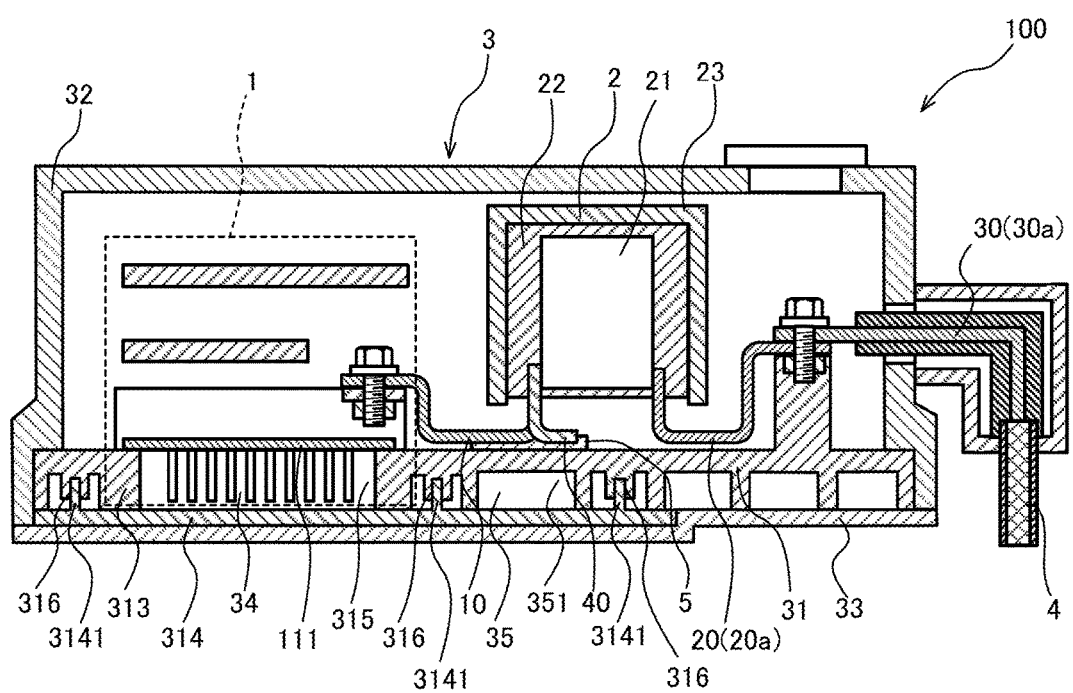
FIG. 10 is a schematic sectional view of an electric power converter according to a third embodiment.

With reference to FIG. 10, an electric power converter 100 according to a third embodiment will be described. The same elements as the other embodiments will be given the same reference signs and will not be described.

FIG. 10 is a schematic sectional view of the electric power converter 100 according to the third embodiment. As shown in FIG. 10, in the present embodiment, a base portion 31 includes a second cooling passage 35 (second coolant flow passage) through which cooling water (coolant) flows below elastic conductive members 5.

As shown in FIG. 10, a main body portion 313 of the base portion 31 has a recessed portion 351 whose bottom surface is open below a position opposing conductor portions 10, 40, that is, below the elastic conductive members 5. The main body portion 313 also has joining portions 316 which are holes whose lower surfaces are open around an opening 315 and around the recessed portion 351.

A bottom plate portion 314 of the base portion 31 has an outer shape of such size that the bottom surfaces of both the opening 315 of the main body portion 313 and the recessed portion 351 can be covered, and has projected portions 3141 projecting upward from an upper surface of the bottom plate portion 314 at positions corresponding to the joining portions 316. The projected portions 3141 and the joining portions 316 of the main body portion 313 are joined to each other by welding, etc. By joining the main body portion 313 and the bottom plate portion 314, a cooling passage 34 enclosed by the main body portion 313, the bottom plate portion 314, and a substrate 111 of a power module 11 is formed at a position of the opening 315. The second cooling passage 35 enclosed by the main body portion 313 and the bottom plate portion 314 is formed at a position of the recessed portion 351.

The cooling passage 35 is a flow passage through which the cooling water for cooling a smoothing capacitor 2 flows, and is formed below the position opposing the conductor portions 10, 40, that is, below the elastic conductive members 5, and connected to the cooling passage 34. Therefore, the cooling water circulates and flows through the cooling passage 34 and the cooling passage 35. In such a way, by providing the second cooling passage 35 below the position opposing the conductor portions 10, 40, in comparison to a case where the base portion 31 has only the cooling passage 34, a heat transfer path between the conductor portions 10, 40 and the cooling water is shortened, and it is possible to further improve a performance of cooling the smoothing capacitor 2. As well as the modified example of the second embodiment, the conductor portions 10, 40 are placed in contact with the base portion 31 of a housing 3 via the highly-conductive elastic conductive members 5. However, as the base portion 31 is made of an insulating material, an insulation property between the conductor portions 10, 40 and the housing 3 is ensured.

Regarding the cooling passage 34 and the cooling passage 35, the cooling passage 34 may be placed on the upstream side in a case where an inverter 1 (power module 11) needs to be cooled more than the smoothing capacitor 2, and the cooling passage 35 may be placed on the upstream side in a case where the smoothing capacitor 2 needs to be cooled more.

With the electric power converter 100 according to the third embodiment described above, it is possible to obtain the following effect.

In the electric power converter 100, the base portion 31 of the housing 3 is made of an insulating resin material, and the base portion 31 includes the cooling passage 35 (second coolant flow passage) through which the cooling water (coolant) flows below a part opposing the conductor portions 10, 40, that is, below the elastic conductive members 5. That is, by making the base portion 31 of an insulating material, the insulation property between the conductor portions 10, 40 and the housing 3 is ensured, and the second cooling passage 35 is provided below the elastic conductive members 5 placed in contact with the conductor portions 10, 40. Thereby, in comparison to a case where the base portion 31 has only the cooling passage 34 configured to cool the inverter 1, the heat transfer path between the conductor portions 10, 40 and the cooling water is shortened, and the performance of cooling the smoothing capacitor 2 is further improved. That is, it is possible to further improve the performance of cooling the smoothing capacitor 2 while ensuring the insulation property of the housing 3 and the conductor portions 10, 40.

In the present embodiment, the elastic conductive members 5 are placed between the conductor portions 10, 40 and the base portion 31. However, the conductor portions 10, 40 may be placed in direct contact with the base portion 31 without placing the elastic conductive members 5 in-between.

In the present embodiment, the cooling passage 34 and the cooling passage 35 are connected to each other, and the cooling water circulates between the cooling passage 34 and the cooling passage 35. However, the cooling passage 34 and the cooling passage 35 may be respectively independent and separate flow passages and both the flow passages may not be connected to each other.

In the present embodiment, the cooling passage 35 is provided in the part of the base portion 31 opposing the conductor portions 10, 40. However, the cooling passage 35 may be provided only at a position opposing any one of the conductor portions 10 and the conductor portions 40, or the cooling passage 35 may be provided in a part opposing the conductor portions 20. A cooling passage 45 may be provided in the part of the base portion 31 opposing the conductor portions 10, 40 and further another cooling passage may be provided in the part opposing the conductor portions 20.

Fourth Embodiment

Figure 11:
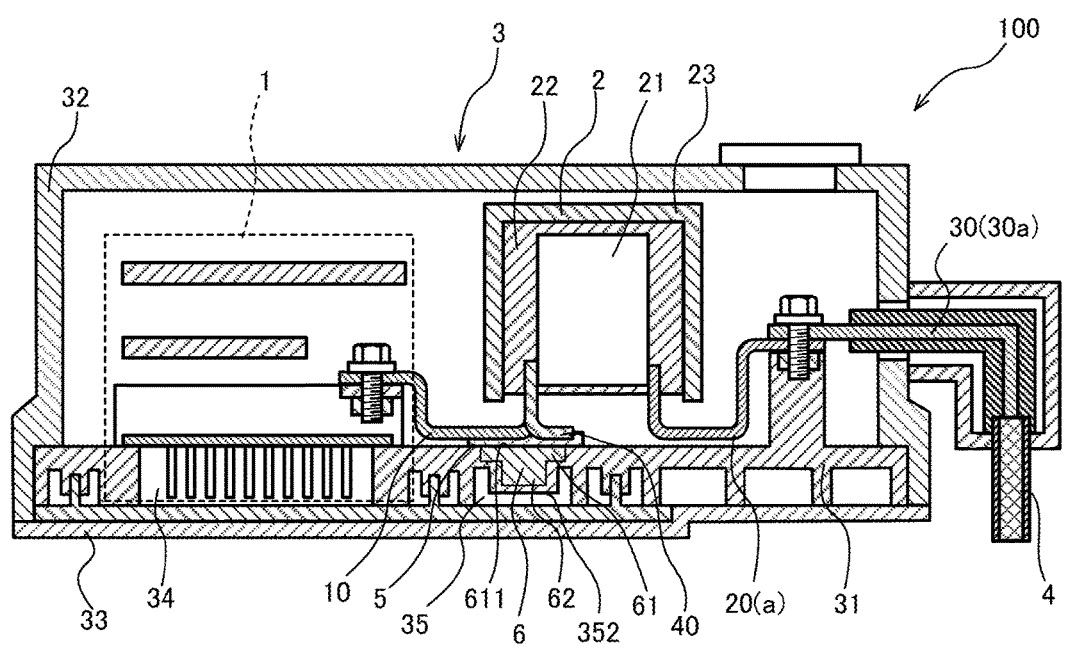
FIG. 11 is a schematic sectional view of an electric power converter according to a fourth embodiment.

With reference to FIG. 11, an electric power converter 100 according to a fourth embodiment will be described. The same elements as the other embodiments will be given the same reference signs and will not be described.

FIG. 11 is a schematic sectional view of the electric power converter 100 according to the fourth embodiment. As shown in FIG. 11, in the present embodiment, a point that a base portion 31 includes a metal member 6 is different from the third embodiment.

As shown in FIG. 11, the base portion 31 includes a cooling passage 35 (second coolant flow passage) through which cooling water that cools a smoothing capacitor 2 flows and the metal member 6 provided at a position opposing the cooling passage 35. The cooling passage 35 has a substantially-U-shaped sectional shape in which a recessed portion 352 is formed in the center of a section seen from the front side.

The metal member 6 is made of a highly-conductive metal material such as copper and aluminum, and provided at the position opposing the cooling passage 35 immediately below elastic conductive members 5. The metal member 6 has a T shape in the section seen from the front side of the cooling passage 35, and includes an upper portion 61 having an upper surface 611 placed in contact with the elastic conductive members 5 and a projected portion 62 projecting toward the recessed portion 351 of the cooling passage 35. The metal member 6 is integrated with the base portion 31 by insert molding, outsert molding by press-fitting, etc.

In such a way, the metal member 6 having high thermal conductivity is provided at the position opposing the cooling passage 35 to project toward the cooling passage 35. Thus, it is possible to efficiently transfer heat of conductor portions 10, 40 connected to the smoothing capacitor 2 to the vicinity of the cooling passage 35 via the elastic conductive members 5 and the metal member 6. The base portion 31 made of a resin material is placed between the metal member 6 and the cooling passage 35. Thus, an insulation property between the metal member 6, and a casing 3 and the cooling water is ensured, so that an insulation property of the conductor portions 10, 40 and the casing 3 is ensured.

The cooling passage 35 is provided in a substantially-U shape in the section seen from the front side. Thus, in comparison to a case where a circular or square cooling passage is provided, a contact surface area of the cooling water and the base portion 31 is increased. Thereby, a rate of heat exchange between the cooling water and the base portion 31 is improved, and a rate of heat exchange made via the base portion 31 between the cooling water and the conductor portions 10, 40 is also improved. Therefore, a performance of cooling the smoothing capacitor 2 connected to the conductor portions 10, 40 is further improved.

With the electric power converter 100 according to the fourth embodiment described above, it is possible to obtain the following effects.

In the electric power converter 100, the base portion 31 of the casing 3 is made of an insulating resin material, the base portion 31 includes the metal member 6 placed in contact with the elastic conductive members 5, and the metal member 6 is provided at the position opposing the cooling passage 35. In such a way, the metal member 6 placed in contact with the elastic conductive members 5 is provided at the position opposing the cooling passage 35. Thus, it is possible to efficiently transfer heat of the conductor portions 10, 40 connected to the smoothing capacitor 2 to the vicinity of the cooling passage 35 via the elastic conductive members 5 and the metal member 6. The base portion 31 made of a resin material is placed between the metal member 6 and the cooling passage 35. Thus, the insulation property between the metal member 6, and the casing 3 and the cooling water is ensured, so that the insulation property of the conductor portions 10, 40 and the casing 3 is ensured. Therefore, it is possible to further improve efficiency of cooling the smoothing capacitor 2 while ensuring the insulation property between the conductor portions 10, 40 and the casing 3.

In the electric power converter 100 according to the present embodiment, the metal member 6 placed in contact with the elastic conductive members 5 also functions as a thermal mass member configured to store heat of the conductor portions 10, 40. Therefore, thermal capacity of the base portion 31 is increased by the metal member 6. Thus, it is possible to suppress and lower a temperature increase of the smoothing capacitor 2 connected to the conductor portions 10, 40, so that a transient heat performance of the smoothing capacitor 2 is improved.

In the present embodiment, the metal member 6 is provided immediately below the elastic conductive members 5 placed in contact with the conductor portions 10, 40. However, the elastic conductive members 5, the metal member 6 placed in contact with the elastic conductive members 5, and the cooling passage 35 may be provided below conductor portions 20.

In order to increase the contact surface area of the cooling water and the base portion 31, it is preferable to form the section of the cooling passage 35 in a substantially U shape and to form the section of the metal member 6 in a T shape to bring the metal member 6 closer to the cooling water. However, the shapes of the cooling passage 35 and the metal member 6 are not necessarily limited to this. As long as the metal member 6 is in contact with the elastic conductive members 5 and the base portion 31 is placed between the metal member 6 and the cooling passage 35, the cooling passage 35 and the metal member 6 may be formed in any shapes.

Modified Example of Fourth Embodiment

Figure 12:
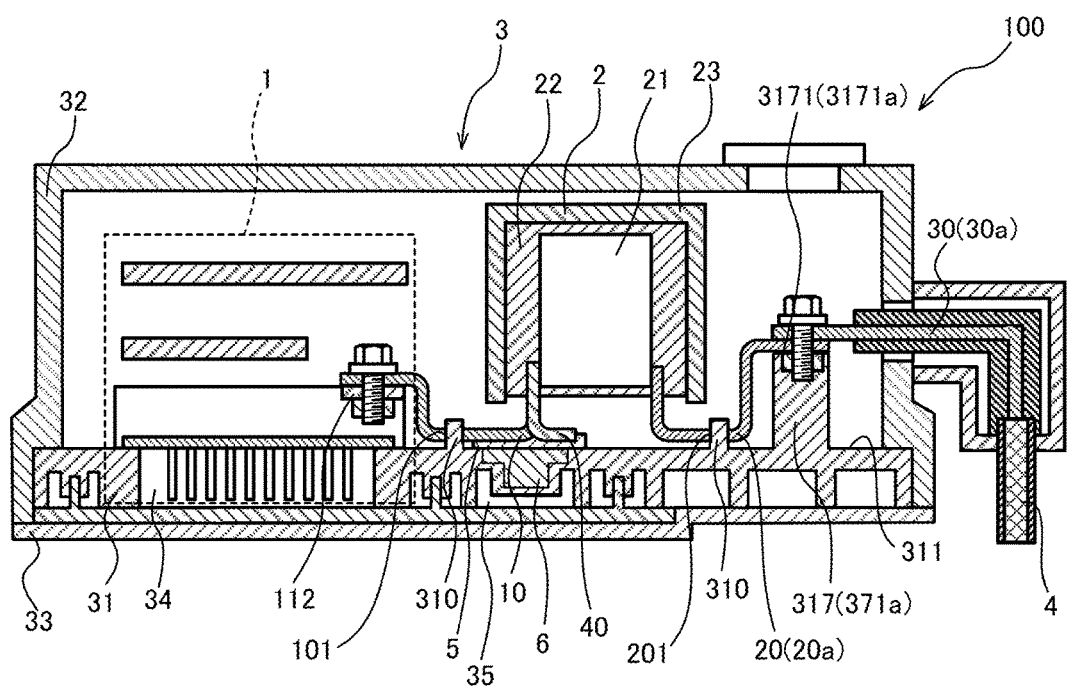
FIG. 12 is a schematic sectional view of an electric power converter according to a modified example of the fourth embodiment.
Figure 13:
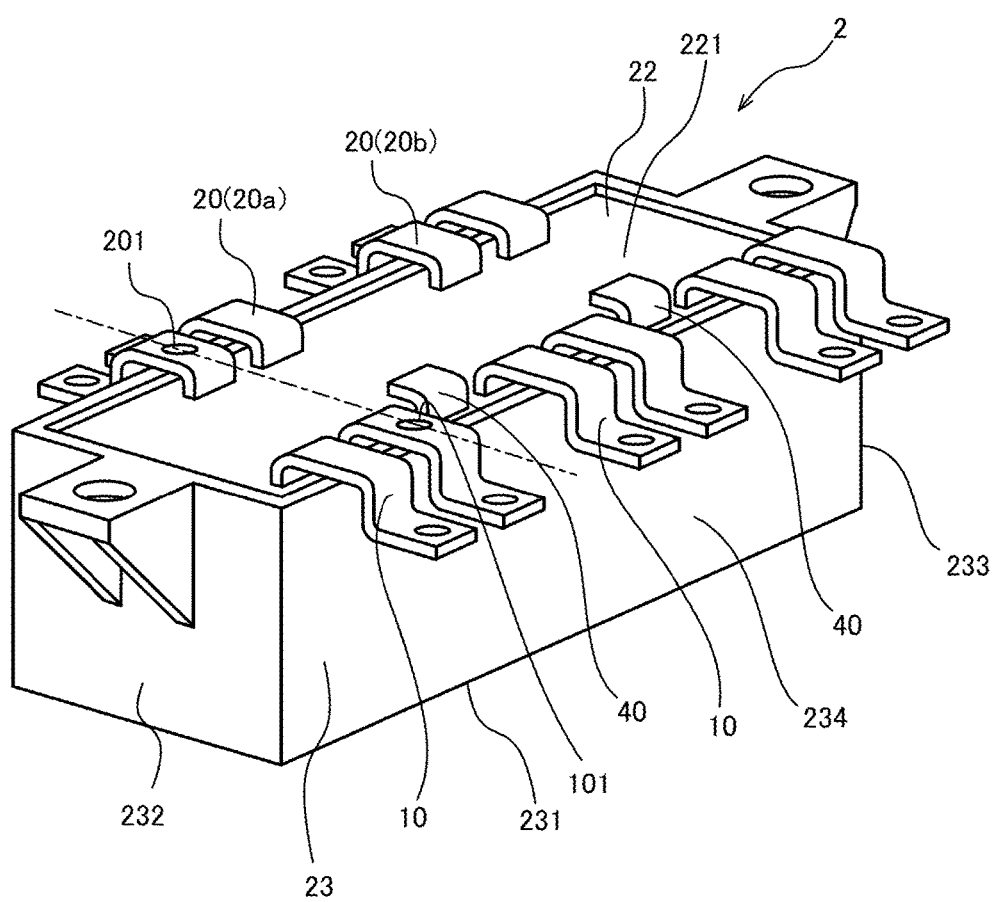
FIG. 13 is a perspective bottom view of a smoothing capacitor.

With reference to FIGS. 12 and 13, a modified example of the electric power converter 100 according to the fourth embodiment will be described. The same elements as the other embodiments will be given the same reference signs and will not be described.

FIG. 12 is a schematic sectional view of an electric power converter 100 according to the modified example of the fourth embodiment. FIG. 13 is a perspective bottom view of a smoothing capacitor 2. As shown in FIGS. 12 and 13, in the present modified example, a base portion 31 has projecting portions 310 configured to position the smoothing capacitor 2, and holes 101, 201 (positioning holes) into which the projecting portions 310 are inserted are formed in conductor portions 10, 20.

As shown in FIG. 12, the base portion 31 has the projecting portions 310 projecting from a surface (mount surface 311) on the side where an inverter 1 and the smoothing capacitor 2 are mounted at positions corresponding to the holes 101, 201 of the conductor portions 10, 20 to be described later. The projecting portions 310 are integrated with the base portion 31 and inserted into the holes 101, 201 of the conductor portions 10, 20.

As shown in FIGS. 12 and 13, the conductor portions 10, 20 projecting downward from a potting surface 221 of the smoothing capacitor 2 includes the holes 101, 201 into which the projecting portions 310 of the base portion 31 are respectively inserted at points in the vicinity of the base portion 31.

The holes 101, 201 are provided in the conductor portion 10 and the conductor portion 20 arranged to oppose each other among the plural conductor portions 10, 20. A center point of the hole 101 of the conductor portion 10 and a center point of the hole 201 of the conductor portion 20 opposing the conductor portion 10 are arranged on a straight line parallel to a front surface 232 and a back surface 233 of the smoothing capacitor 2. By inserting the projecting portions 310 of the base portion 31 into the holes 101, 201, the smoothing capacitor 2 is positioned and the conductor portions 10, 20 are also positioned.

From the viewpoint to ensure stability of positioning of the smoothing capacitor 2, the holes 101, 201 are preferably provided in the conductor portions 10 and 20 arranged to oppose each other. However, the present invention is not limited to this. For example, the holes 101, 201 may be provided in the conductor portions not opposing each other, or positioning holes may be provided in conductor portions 40. Further, in the present embodiment, the one hole 101 and the one hole 201 are provided respectively in the conductor portion 10 and the conductor portion 20. However, the number of the conductor portions in which the holes 101, 201 are provided is not limited to this but, for example, positioning holes may be provided in all the conductor portions.

According to the modified example of the fourth embodiment described above, it is possible to further obtain the following effect.

In the electric power converter 100, the base portion 31 of a housing 3 has the projecting portions 310 projecting from the surface (mount surface 311) on the side where the inverter 1 and the smoothing capacitor 2 are mounted, and the holes (positioning holes) 101, 201 into which the projecting portions 310 are inserted are provided in the conductor portions 10, 20. By inserting the projecting portions 310 of the base portion 31 into the holes 101, 201 of the conductor portions 10, 20, the smoothing capacitor 2 is positioned and the conductor portions 10, 20 are also positioned. In such a way, the conductor portions 10, 20 are directly positioned. Thus, precision of positioning the conductor portions 10, 20 with respect to terminal portions 112, 317 is improved, so that connection quality of the conductor portions at the terminal portions 112, 317 is improved.

Fifth Embodiment

Figure 14:
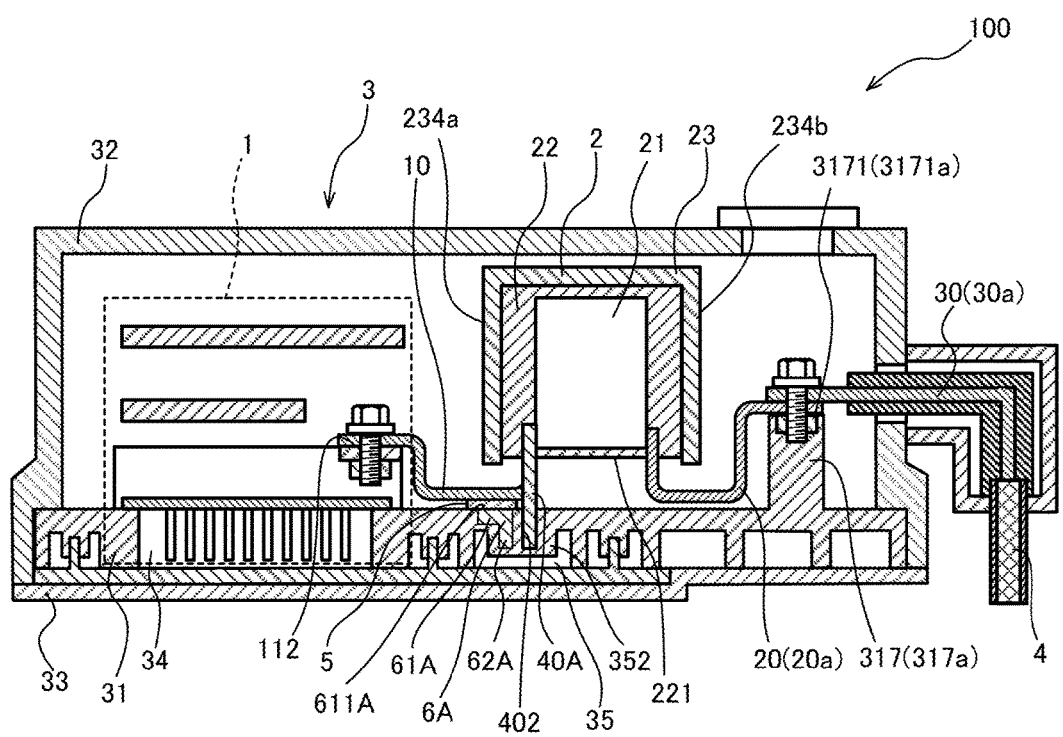
FIG. 14 is a schematic sectional view of an electric power converter according to a fifth embodiment.
Figure 15:
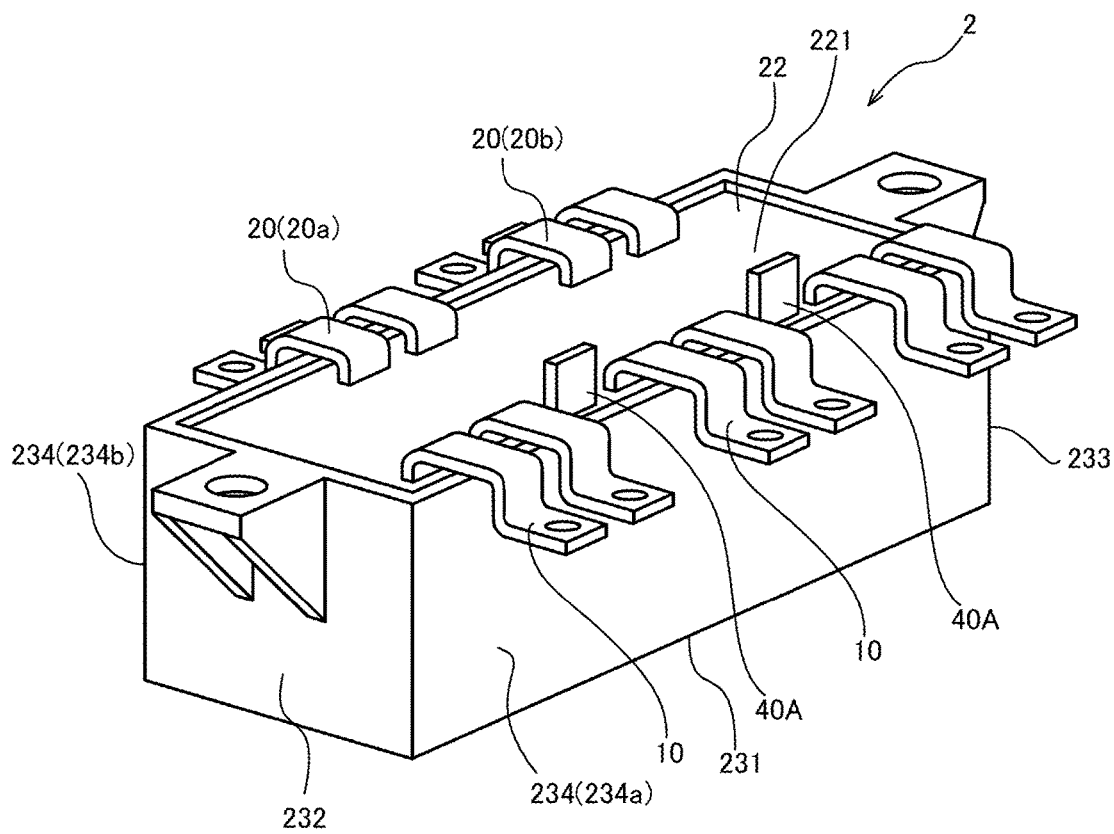
FIG. 15 is a perspective bottom view of a smoothing capacitor.

With reference to FIGS. 14 and 15, an electric power converter 100 according to a fifth embodiment will be described. The same elements as the other embodiments will be given the same reference signs and will not be described.

FIG. 14 is a schematic sectional view of the electric power converter 100 according to the fifth embodiment. FIG. 15 is a perspective bottom view of a smoothing capacitor 2. As shown in FIGS. 14 and 15, in the present embodiment, a point that conductor portions 40A (third conductor portions) configured to cool the smoothing capacitor 2 project from a potting surface 221 of the smoothing capacitor 2 and are inserted into a base portion 31 at positions opposing a cooling passage 35 is different from the other embodiments.

As shown in FIG. 14, the base portion 31 has a metal member 6A having high thermal conductivity, the cooling passage 35 formed in a substantially U shape in a section seen from the front side, and a groove 402 into which the conductor portions 40A configured to cool the smoothing capacitor 2 are inserted.

The cooling passage 35 has a substantially-U-shaped sectional shape in which a recessed portion 352 is formed in the center of the section seen from the front side as well as the fourth embodiment.

The metal member 6A is provided at a position opposing the cooling passage 35 immediately below elastic conductive members 5, and has a L shape in a section seen from the front side of the cooling passage 35. The metal member 6A includes an upper portion 61A having an upper surface 611A placed in contact with the elastic conductive members 5 and a projected portion 62A projecting toward the recessed portion 352 of the cooling passage 35. The projected portion 62A is provided to extend to the vicinity of the cooling passage 35, and transfers heat of the smoothing capacitor 2 transmitted to the metal member 6A via conductor portions 10 and the elastic conductive members 5 to the vicinity of cooling water flowing through the cooling passage 35. The base portion 31 made of a resin material is placed between the metal member 6A and the cooling passage 35. Thus, an insulation property between the metal member 6A, and a housing 3 and the cooling water is ensured, so that an insulation property of the conductor portions 10 and the housing 3 is ensured.

The groove 402 formed in the base portion is a groove into which the conductor portions 40A configured to cool the smoothing capacitor 2 are inserted, and is formed to the vicinity of the cooling passage 35 toward the recessed portion 352 of the cooling passage 35.

The conductor portions 40A are members configured to cool the capacitor, and one ends are connected to a capacitor element 21 of the smoothing capacitor 2 and project downward to the outside of the smoothing capacitor 2 from the vicinity of a one-side side surface 234a of a capacitor case 23 on the potting surface 221 of the smoothing capacitor 2. The other ends of the conductor portions 40A are inserted into the groove 402 of the base portion 31 by light press-fitting, etc. As shown in FIGS. 14 and 15, the conductor portions 40A are not bent but project from the potting surface 221 of the smoothing capacitor 2 and is provided to extend to the vicinity of the cooling passage 35. Thereby, heat of the smoothing capacitor 2 is transferred to the vicinity of the cooling water flowing through the cooling passage 35 by the conductor portions 40A. Since the base portion 31 is made of an insulating resin material, an insulation property of the conductor portions 40A inserted into the base portion 31 and the housing 3 is ensured. By inserting the conductor portions 40A into the base portion 31, it is possible to position the smoothing capacitor 2 and to position conductor portions 10, 20 with respect to terminal portions 112, 317.

With the electric power converter 100 according to the fifth embodiment described above, it is possible to obtain the following effects.

In the electric power converter 100, the base portion 31 of the housing 3 is made of an insulating resin material, and the conductor portions 40A (third conductor portions) whose one ends are connected to the smoothing capacitor 2 are inserted into the base portion 31 at positions opposing the cooling passage 35. Thereby, heat of the smoothing capacitor 2 is transferred to the vicinity of the cooling water flowing through the cooling passage 35 by the conductor portions 40A. Meanwhile, since the base portion 31 is made of an insulating resin material, the insulation property of the conductor portions 40A inserted into the base portion 31 and the housing 3 is ensured. Therefore, it is possible to further improve a performance of cooling the smoothing capacitor 2 while ensuring the insulation property between the conductor portions 40A and the housing 3.

By inserting the conductor portions 40A into the base portion 31, it is possible to position the smoothing capacitor 2 and to position the conductor portions 10, 20 with respect to the terminal portions 112, 317. In such a way, by making positioning not with positioning pins 25 of the capacitor case 23 but with the conductor portions 40A, precision of positioning the conductor portions 10, 20 with respect to the terminal portions 112, 317 is improved, so that connection quality of the conductor portions at the terminal portions 112, 317 is stabilized.

In the present embodiment, the section of the metal member 6A is formed in an L shape and the section of the cooling passage 35 is formed in a substantially U shape. However, the shapes of the metal member 6A and the cooling passage 35 are not limited to this. As long as one ends of the conductor portions 40A and the metal member 6A are positioned in the vicinity of the cooling passage 35, the metal member 6A and the cooling passage 35 may be formed in any shapes.

Sixth Embodiment

Figure 16:
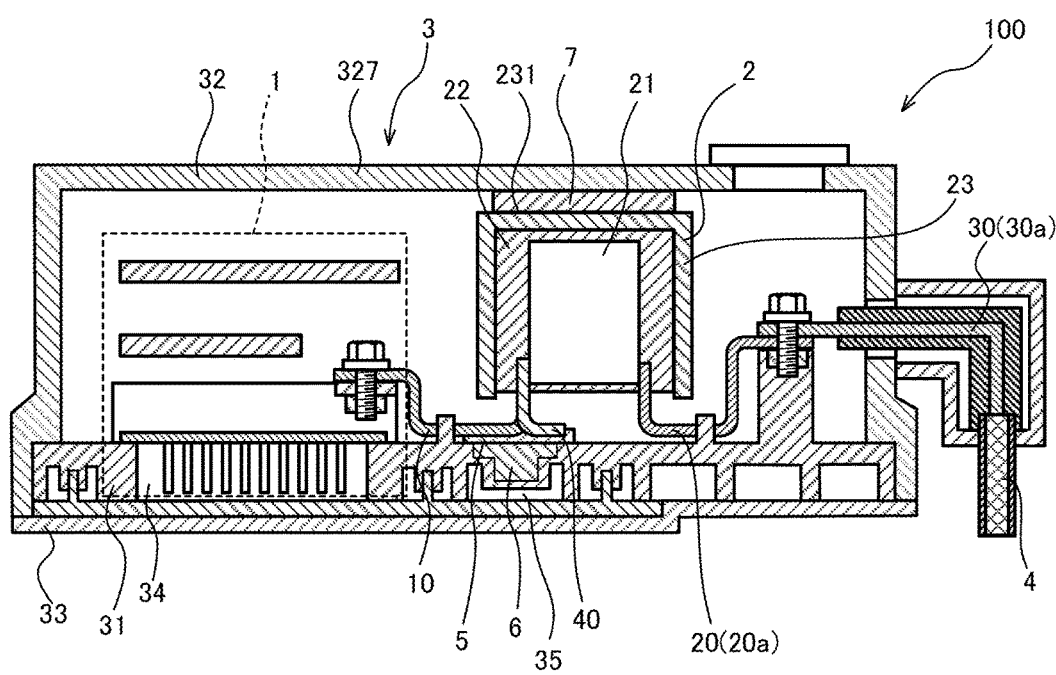
FIG. 16 is a schematic sectional view of an electric power converter according to a sixth embodiment.
Figure 17:
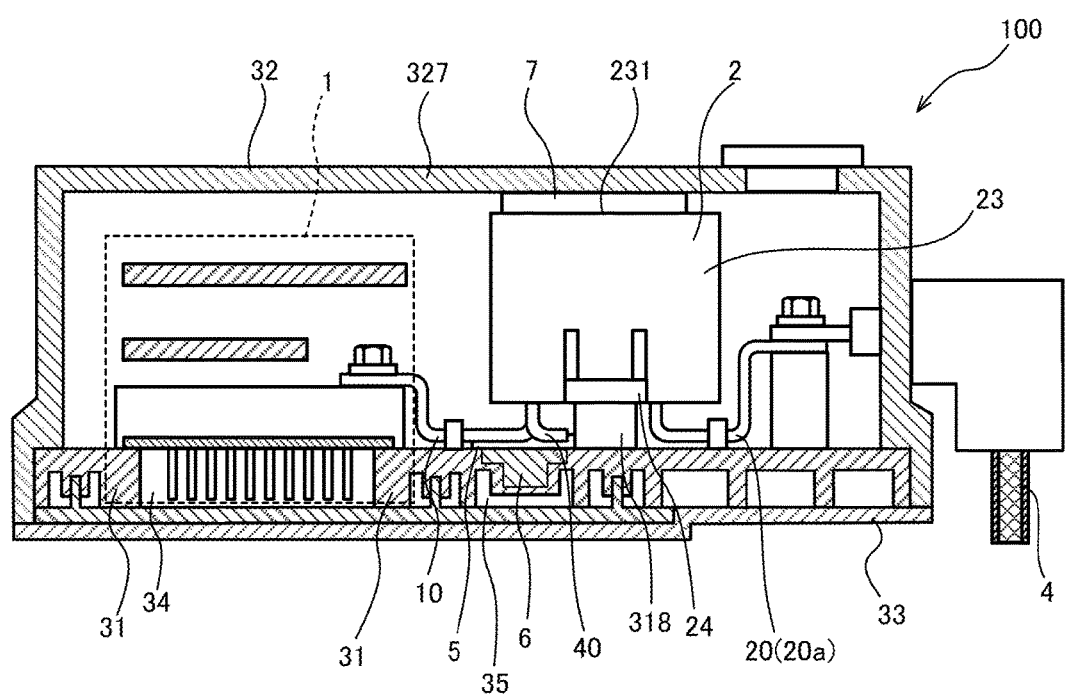
FIG. 17 is a schematic sectional view of the electric power converter showing an outer appearance of a smoothing capacitor.

With reference to FIGS. 16 and 17, an electric power converter 100 according to a fifth embodiment will be described. The same elements as the other embodiments will be given the same reference signs and will not be described.

FIG. 16 is a schematic sectional view of the electric power converter 100 according to the sixth embodiment. FIG. 17 is a perspective sectional view of the electric power converter 100 showing an outer appearance of a smoothing capacitor 2. As shown in FIGS. 16 and 17, in the present embodiment, a point that an elastic member 7 is sandwiched between an upper surface 231 of the smoothing capacitor 2 and a cover portion 32 of a housing 3, and a point that the smoothing capacitor 2 and the housing 3 are not fastened by bolts, etc. are different from the other embodiments.

As shown in FIG. 16, the elastic member 7 is sandwiched between the upper surface 231 of the smoothing capacitor 2

(capacitor case 23) and an upper portion 327 of the cover portion 32 of the housing 3. The elastic member 7 is made of an elastic material having higher thermal conductivity than the capacitor case 23, and a lower surface 71 is placed in contact with the upper surface 231 of the smoothing capacitor 2 and an upper surface 72 is placed in contact with an inside surface of the upper portion 327 of the cover portion 32. In such a way, the upper surface 231 of the smoothing capacitor 2 is placed in contact with the cover portion 32 of the housing 3 via the elastic member 7. Thus, up-down movement of the smoothing capacitor 2 is regulated. In such a way, the up-down movement of the smoothing capacitor 2 is regulated by the elastic member 7. Thus, in the present embodiment, as shown in FIG. 17, brackets 24 of the smoothing capacitor 2 and holding portions 318 of a base portion 31 are not fastened by bolts, etc.

The elastic member 7 may be a conductive member or an insulating member as long as the elastic member 7 is an elastic member having high thermal conductivity.

With the electric power converter 100 according to the sixth embodiment described above, it is possible to obtain the following effects.

In the electric power converter 100, the upper surface 231 of the smoothing capacitor 2 is placed in contact with the cover portion 32 of the housing 3 via the elastic member 7. Thereby, the up-down movement of the smoothing capacitor 2 is regulated. Thus, there is no need for fastening the capacitor case 23 of the smoothing capacitor 2 and the base portion 31 of the housing 3 by bolts, etc. Therefore, it is possible to shorten takt time at the time of manufacture.

The elastic member 7 placed between the smoothing capacitor 2 and the cover portion 32 of the housing 3 is made of an elastic material having higher thermal conductivity than the capacitor case 23. Therefore, it is possible to transfer heat of the smoothing capacitor 2 from the elastic member 7 to the cover portion 32 made of a metal material. Thus, it is possible to suppress a temperature increase of the smoothing capacitor 2.

Figure 18:
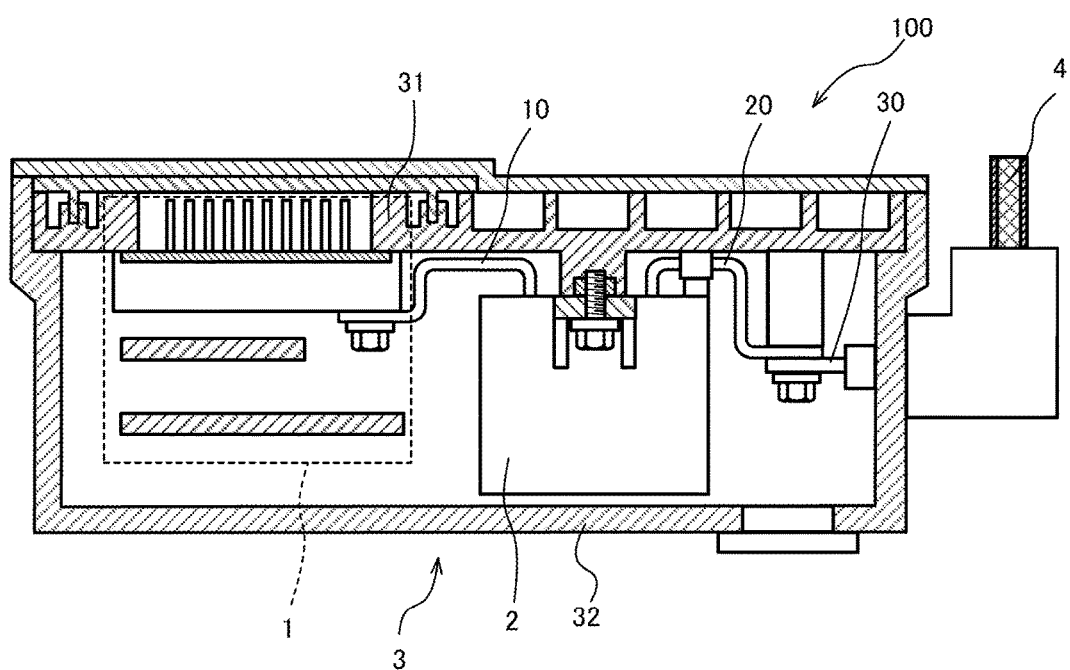
FIG. 18 is a schematic sectional view of an electric power converter according to another embodiment.

In any of the embodiments, the electric power converter 100 is not necessarily disposed with the base portion 31 of the housing 3 being arranged on the lower side but may be arranged freely in terms of the direction according to layout of a vehicle in which the electric power converter 100 is disposed. For example, as shown in FIG. 18, the electric power converter 100 shown in FIG. 1, etc. may be installed in an upside-down state so that the base portion 31 is placed on the upper side and the cover portion 32 is placed on the lower side. In addition, the electric power converter 100 may be installed while being tilted.

In any of the embodiments, the coolant flowing through the cooling passage is the cooling water. However, the coolant is not limited to this but may be, for example, a coolant gas.

The embodiments of the present invention are described above. However, the above embodiments only show part of application examples of the present invention and do not intend to limit the technical scope of the present invention to the specific configurations of the above embodiments.

Although each of the above embodiments is described as an independent embodiment, the embodiments may be combined appropriately.

The invention claimed is:

1. An electric power converter, comprising:
an inverter which comprises plural electric parts;
a smoothing capacitor configured to smooth electric power;
a housing configured to house the inverter and the smoothing capacitor; and
a first conductor portion that connects the smoothing capacitor and the inverter, wherein:
the housing comprises a base portion on which the inverter and the smoothing capacitor are mounted, the base portion being made of an insulating resin material, and a cover portion directly attached to the insulating resin material of the base portion to cover the inverter and the smoothing capacitor, and
a part of the first conductor portion between the smoothing capacitor and the inverter is located in a vicinity of or in contact with the base portion of the housing.

2. The electric power converter according to claim 1, further comprising:
a second conductor portion configured to connect the smoothing capacitor and a power source outside the housing, wherein
the second conductor portion is located in the vicinity of or in contact with the base portion of the housing in the middle of connection between the smoothing capacitor and the power source.

3. The electric power converter according to claim 1, further comprising:
an additional conductor portion configured to cool the smoothing capacitor, wherein
the additional conductor portion has a part connected to the smoothing capacitor and located in the vicinity of or in contact with the base portion of the housing.

4. The electric power converter according to claim 3, further comprising:
an elastic conductive member in contact with the base portion of the housing, wherein
at least any of the first conductor portion, the second conductor portion, and the additional conductor portion is in contact with the elastic conductive member in a part located in the vicinity of the base portion.

5. The electric power converter according to claim 1, wherein:
the base portion comprises a first coolant flow passage through which a coolant that cools the inverter flows below a part where the inverter is mounted.

6. The electric power converter according to claim 5, wherein:
the base portion comprises a second coolant flow passage through which the coolant flows below a part opposing at least the first conductor portion.

7. The electric power converter according to claim 4, wherein:
the base portion comprises a metal member in contact with the elastic conductive member, a first coolant flow passage through which a coolant that cools the inverter flows, the first coolant flow passage being formed below a part where the inverter is mounted, and a second coolant flow passage through which the coolant flows, the second coolant flow passage being formed below a part in contact with the elastic conductive member, and
the metal member is provided at a position opposing the second coolant flow passage.

8. The electric power converter according to claim 3, wherein:
the base portion comprises:
a first coolant flow passage through which a coolant that cools the inverter flows below a part where the inverter is mounted, and a second coolant flow passage through which the coolant flows below a part opposing at least the third conductor portion, and the additional conductor portion is inserted into the base portion at a position opposing a vicinity of the second coolant flow passage.

9. The electric power converter according to claim 2, wherein:

the base portion has a projecting portion projecting from a surface on the side where the inverter and the smoothing capacitor are mounted, and a positioning hole into which the projecting portion is inserted is provided in at least any of the first conductor portion and the second conductor portion.

10. The electric power converter according to claim 1, wherein:

an upper surface of a capacitor case of the smoothing capacitor is in contact with the cover portion of the housing via an elastic member.

11. The electric power converter according to claim 10, wherein:

the elastic member is made of a material having higher thermal conductivity than the capacitor case.

\* \* \* \* \*